(12) United States Patent
Solomon

(10) Patent No.: US 7,692,448 B2
(45) Date of Patent: Apr. 6, 2010

(54) REPROGRAMMABLE THREE DIMENSIONAL FIELD PROGRAMMABLE GATE ARRAYS

(76) Inventor: Neal Solomon, P.O. Box 21297, Oakland, CA (US) 94620

( * ) Notice: Subject to any disclaimer, the term of this patent is extended or adjusted under 35 U.S.C. 154(b) by 4 days.

(21) Appl. No.: 12/283,444

(22) Filed: Sep. 12, 2008

(65) Prior Publication Data

US 2009/0066365 A1    Mar. 12, 2009

Related U.S. Application Data

(60) Provisional application No. 60/993,683, filed on Sep. 12, 2007.

(51) Int. Cl.
*H03K 19/177* (2006.01)

(52) U.S. Cl. .......................................... 326/38; 326/41
(58) Field of Classification Search ............... 326/37–41
See application file for complete search history.

(56) References Cited

U.S. PATENT DOCUMENTS

| | | | |
|---|---|---|---|
| 6,819,136 B2 * | 11/2004 | Or-Bach | 326/41 |
| 6,891,397 B1 * | 5/2005 | Brebner | 326/41 |
| 6,917,219 B2 * | 7/2005 | New | 326/41 |
| 7,064,579 B2 * | 6/2006 | Madurawe | 326/39 |
| 7,282,951 B2 * | 10/2007 | Huppenthal et al. | 326/41 |

* cited by examiner

*Primary Examiner*—Don P Le

(57) ABSTRACT

3D FPGAs are elucidated with (a) interlayer information sharing, (b) intermittent and variable timing of layer configuration and (c) multilayer multi-functionality. 3D FPGAs are applied to reprogrammable SoCs.

11 Claims, 16 Drawing Sheets

FIG. 24

|  | Specific App. | Evolutionary environment |
|---|---|---|
| ASIC | Optimize metaheuristic algorithm | |
| FPGA | Optimization metaheuristic algorithm<br>- BOOPs<br>- MOOPs<br><br>(prediction) | GA metaheuristic for combinatotial optimization (EMOOPs)<br><br>(antipication) |

REPROGRAMMABLE THREE DIMENSIONAL FIELD PROGRAMMABLE GATE ARRAYS

CROSS-REFERENCES TO RELATED APPLICATIONS

The present application claims the benefit of priority under U.S.C. §119 from U.S. Provisional Patent Application Ser. No. 60/993,683 filed on Sep. 12, 2007, the disclosure of which is hereby incorporated by reference in their entirety for all purposes.

FIELD OF INVENTION

The invention involves reprogrammable multilayer integrated circuitry consisting of field programmable gate array (FPGA) and complex programmable logic device (CPLD) architectures. Components of the present invention involve micro-electro mechanical systems (MEMS) and nano-electro-mechanical systems (NEMS). Because the system is a hybrid heterostructure semiconductor device that incorporates evolvable hardware, the system is exemplar of polymorphous computing architecture (PCA) and cognitive computing.

BACKGROUND

The challenge of modern computing is to build economically efficient chips that incorporate more transistors to meet the goal of achieving Moore's law of doubling performance every two years. The limits of semiconductor technology are affecting this ability to grow in the next few years, as transistors become smaller and chips become bigger and hotter. The semiconductor industry has developed the system on a chip (SoC) as a way to continue high performance chip evolution.

So far, there have been four main ways to construct a high performance semiconductor. First, chips have multiple cores. Second, chips optimize software scheduling. Third, chips utilize efficient memory management. Fourth, chips employ polymorphic computing. To some degree, all of these models evolve from the Von Neumann computer architecture developed after WWII in which a microprocessor's logic component fetches instructions from memory.

The simplest model for increasing chip performance employs multiple processing cores. By multiplying the number of cores by eighty, Intel has created a prototype teraflop chip design. In essence, this architecture uses a parallel computing approach similar to supercomputing parallel computing models. Like some supercomputing applications, this approach is limited to optimizing arithmetic-intensive applications such as modeling.

The Tera-op, Reliable, Intelligently Adaptive Processing System (TRIPS), developed at the University of Texas with funding from DARPA, focuses on software scheduling optimization to produce high performance computing. This model's "push" system uses data availability to fetch instructions, thereby putting additional pressure on the compiler to organize the parallelism in the high speed operating system. There are three levels of concurrency in the TRIPS architecture, including instruction-level parallelism (ILP), thread-level parallelism (TLP) and data-level parallelism (DLP). The TRIPS processor will process numerous instructions simultaneously and map them onto a grid for execution in specific nodes. The grid of execution nodes is reconfigurable to optimize specific applications. Unlike the multi-core model, TRIPS is a uniprocessor model, yet it includes numerous components for parallelization.

The third model is represented by the Cell microprocessor architecture developed jointly by the Sony, Toshiba and IBM (STI) consortium. The Cell architecture uses a novel memory "coherence" architecture in which latency is overcome with a bandwidth priority and in which power usage is balanced with peak computational usage. This model integrates a microprocessor design with coprocessor elements; these eight elements are called "synergistic processor elements" (SPEs). The Cell uses an interconnection bus with four unidirectional data flow rings to connect each of four processors with their SPEs, thereby meeting a teraflop performance objective. Each SPE is capable of producing 32 GFLOPS of power in the 65 nm version, which was introduced in 2007.

The MOrphable Networked Micro-ARCHitecture (MONARCH) uses six reduced instruction set computing (RISC) microprocessors, twelve arithmetic clusters and thirty-one memory clusters to achieve a 64 GFLOPS performance with 60 gigabytes per second of memory. Designed by Raytheon and USC/ISI from DARPA funding, the MONARCH differs distinctly from other high performance SoCs in that it uses evolvable hardware (EHW) components such as field programmable compute array (FPCA) and smart memory architectures to produce an efficient polymorphic computing platform.

MONARCH combines key elements in the high performance processing system (HPPS) with Data Intensive Architecture (DIVA) Processor in Memory (PIM) technologies to create a unified, flexible, very large scale integrated (VLSI) system. The advantage of this model is that reprogrammability of hardware from one application-specific integrated circuit (ASIC) position to another produces faster response to uncertain changes in the environment. The chip is optimized to be flexible to changing conditions and to maximize power efficiency (3-6 GFLOPS per watt). Specific applications of MONARCH involve embedded computing, such as sensor networks.

These four main high performance SoC models have specific applications for which they are suited. For instance, the multi-core model is optimized for arithmetic applications, while MONARCH is optimized for sensor data analysis. However, all four also have limits.

The multi-core architecture has a problem of synchronization of the parallel micro-processors that conform to a single clocking model. This problem limits their responsiveness to specific types of applications, particularly those that require rapid environmental change. Further, the multi-core architecture requires "thread-aware" software to exploit its parallelism, which is cumbersome and produces quality of service (QoS) problems and inefficiencies.

By emphasizing its compiler, the TRIPS architecture has the problem of optimizing the coordination of scheduling. This bottleneck prevents peak performance over a prolonged period.

The Cell architecture requires constant optimization of its memory management system, which leads to QoS problems.

Finally, MONARCH depends on static intellectual property (IP) cores that are limited to combinations of specified pre-determined ASICs to program its evolvable hardware components. This restriction limits the extent of its flexibility, which was precisely its chief design advantage.

In addition to SoC models, there is a network on a chip (NoC) model, introduced by Arteris in 2007. Targeted to the communications industry, the 45 nm NoC is a form of SoC that uses IP cores in FPGAs for reprogrammable functions and that features low power consumption for embedded computing applications. The chip is optimized for on-chip communications processing. Though targeted at the communications industry, particularly wireless communications, the chip has limits of flexibility that it was designed to overcome, primarily in its deterministic IP core application software.

Various implementations of FPGAs represent reconfigurable computing. The most prominent examples are the Xilinx Virtex-II Pro and Virtex-4 devices that combine one or more microprocessor cores in an FPGA logic fabric. Similarly, the Atmel FPSLIC processor combines an AVR processor with programmable logic architecture. The Atmel microcontroller has the FPGA fabric on the same die to produce a fine-grained reconfigurable device. These hybrid FPGAs and embedded microprocessors represent a generation of system on a programmable chip (SOPC). While these hybrids are architecturally interesting, they possess the limits of each type of design paradigm, with restricted microprocessor performance and restricted deterministic IP core application software. Though they have higher performance than a typical single core microprocessor, they are less flexible than a pure FPGA model.

All of these chip types are two dimensional planar micro system devices. A new generation of three dimensional integrated circuits and components is emerging that is noteworthy as well. The idea to stack two dimensional chips by sandwiching two or more ICs using a fabrication process required a solution to the problem of creating vertical connections between the layers. IBM solved this problem by developing "through silicon vias" (TSVs) which are vertical connections "etched through the silicon wafer and filled with metal." This approach of using TSVs to create 3D connections allows the addition of many more pathways between 2D layers. However, this 3D chip approach of stacking existing 2D planar IC layers is generally limited to three or four layers. While TSVs substantially limit the distance that information traverses, this stacking approach merely evolves the 2D approach to create a static 3D model.

In U.S. Pat. No. 5,111,278, Echelberger describes a 3D multi-chip module system in which layers in an integrated circuit are stacked by using aligned TSVs. This early 3D circuit model represents a simple stacking approach. U.S. Pat. No. 5,426,072 provides a method to manufacture a 3D IC from stacked silicon on insulation (SOI) wafers. U.S. Pat. No. 5,657,537 presents a method of stacking two dimensional circuit modules and U.S. Pat. No. 6,355,501 describes a 3D IC stacking assembly technique.

Recently, 3D stacking models have been developed on chip in which several layers are constructed on a single complementary metal oxide semiconductor (CMOS) die. Some models have combined eight or nine contiguous layers in a single CMOS chip, though this model lacks integrated vertical planes. MIT's microsystems group has created 3D ICs that contain multiple layers and TSVs on a single chip.

3D FPGAs have been created at the University of Minnesota by stacking layers of single planar FPGAs. However, these chips have only adjacent layer connectivity.

3D memory has been developed by Samsung and by BeSang. The Samsung approach stacks eight 2-Gb wafer level processed stack packages (WSPs) using TSVs in order to minimize interconnects between layers and increase information access efficiency. The Samsung TSV method uses tiny lasers to create etching that is later filled in with copper. BeSang combines 3D package level stacking of memory with a logic layer of a chip device using metal bonding.

See also U.S. Pat. No. 5,915,167 for a description of a 3D DRAM stacking technique, U.S. Pat. No. 6,717,222 for a description of a 3D memory IC, U.S. Pat. No. 7,160,761 for a description of a vertically stacked field programmable non-volatile memory and U.S. Pat. No. 6,501,111 for a description of a 3D programmable memory device.

Finally, in the supercomputing sphere, the Cray T3D developed a three dimensional supercomputer consisting of 2048 DEC Alpha chips in a torus networking configuration.

In general, all of the 3D chip models merely combine two or more 2D layers. They all represent a simple bonding of current technologies. While planar design chips are easier to make, they are not generally high performance.

Prior systems demonstrate performance limits, programmability limits, multi-functionality limits and logic and memory bottlenecks. There are typically trade-offs of performance and power.

The present invention views the system on a chip as an ecosystem consisting of significant intelligent components. The prior art for intelligence in computing consists of two main paradigms. On the one hand, the view of evolvable hardware (EHW) uses FPGAs as examples. On the other hand, software elements consist of intelligent software agents that exhibit collective behaviors. Both of these hardware and software aspects take inspiration from biological domains.

First, the intelligent SoC borrows from biological concepts of post-initialized reprogrammability that resembles a protein network that responds to its changing environmental conditions. The interoperation of protein networks in cells is a key behavioral paradigm for the iSoC. The slowly evolving DNA root structure produces the protein network elements, yet the dynamics of the protein network are interactive with both itself and its environment.

Second, the elements of the iSoC resemble the subsystems of a human body. The circulatory system represents the routers, the endocrine system is the memory, the skeletal system is comparable to the interconnects, the nervous system is the autonomic process, the immune system provides defense and security as it does in a body, the eyes and ears are the sensor network and the muscular system is the bandwidth. In this analogy, the brain is the central controller.

For the most part, SoCs require three dimensionality in order to achieve high performance objectives. In addition, SoCs require multiple cores that are reprogrammable so as to maintain flexibility for multiple applications. Such reprogrammability allows the chip to be implemented cost effectively. Reprogrammability, moreover, allows the chip to be updatable and future proof. In some versions, SoCs need to be power efficient for use in embedded mobile devices. Because they will be prominent in embedded devices, they also need to be fault tolerant. By combining the best aspects of deterministic microprocessor elements with indeterministic EHW elements, an intelligent SoC efficiently delivers superior performance.

While the design criteria are necessary, economic efficiency is also required. Computational economics reveals a comparative cost analysis that includes efficiency maximization of (a) power, (b) interconnect metrics, (c) transistor per memory metrics and (d) transistor per logic metrics.

Problems that the System Solves

Optimization problems that the system solves can be divided into two classes: bi-objective optimization problems (BOOPs) and multi-objective optimization problems (MOOPs).

BOOPs consist of trade-offs in semiconductor factors such as (a) energy consumption versus performance, (b) number of transistors versus heat dissipation, (c) interconnect area versus performance and (d) high performance versus low cost.

Regarding MOOPs, the multiple factors include: (a) thermal performance (energy/heat dissipation), (b) energy optimization (low power use), (c) timing performance (various metrics), (d) reconfiguration time (for FPGAs and CPLDs), (e) interconnect length optimization (for energy delay), (f) use of space, (g) bandwidth optimization and (h) cost (manufacture and usability) efficiency. The combination of solutions to trade-offs of multiple problems determines the design of specific semiconductors. The present system presents a set of solutions to these complex optimization problems.

One of the chief problems is to identify ways to limit latency. Latency represents a bottleneck in an integrated circuit when the wait to complete a task slows down the efficiency of the system. Examples of causes of latency include interconnect routing architectures, memory configuration and interface design. Limiting latency problems requires the development of methods for scheduling, anticipation, parallelization, pipeline efficiency and locality-priority processing.

SUMMARY

An application specific integrated circuit (ASIC) is a hard wired semiconductor that is organized to perform a specific function. ASICs are particularly used in embedded applications to control a specific function of regular inputs and outputs. Because they only perform a specific function, they maximize efficiency; they do not need more memory or logic capabilities than is necessary to perform the function. As a consequence of these attributes, ASICs are used in high performance environments. They may be as much as a hundred times faster at performing a particular function than a microprocessor is. A microprocessor is designed to perform multiple functions by using multi-application software in a logic circuitry to fetch instructions from memory with each cycle of the circuit's clock. The MP compromises performance for additional flexibility.

A field programmable gate array (FPGA) is a complex programmable logic device (CPLD) that moves from one ASIC hardware position to another ASIC hardware position in order to provide both the flexibility of multiple applications and the performance benefits of an ASIC. FPGAs are programmed after manufacture in order to provide design flexibility to customers and to reduce production time and cost. FPGAs are used for rapid prototyping in uncertain environments and represent a form of evolvable hardware (EHW).

FPGAs are either deterministic, which limits the scope of their programmability, or indeterministic, which allows them to continuously reprogram. A simple deterministic FPGA will alternate between only two or three ASIC hardware circuit positions. Continuous reprogrammability of indeterministic FPGAs, on the other hand, produces hardware evolvability that interacts with an uncertain, and constantly changing, environment. A challenge with traditional CP-FPGAs is that they take too long to restructure their hardware, which is a dilemma in a rapidly changing environment.

The present invention advances the technology for FPGAs. The system describes 3D FPGAs which feature multiple integrated layers in a single complex integrated circuit. The present system incorporates a novel technique for integrating the operation of logic gates on more than one layer. The unique 3D configuration for FPGAs disclosed herein uses look up tables and memory in new ways that provide increased flexibility. The system describes how to share information between layers in a 3D FPGA. Since different layers of a 3D FPGA can operate independently, they may restructure at different times, and at different speeds, which allows the IC to operate while specific layers are transforming positions, thereby reducing latency. Different layers are also used simultaneously for different functions thereby making the 3D FPGA multi-functional overall as well as reprogrammable.

The use of multiple networked 3D FPGAs in a 3D iSoC provides a powerful hardware system that allows the flexibility of reprogrammability with the performance of ASIC arrays.

Novelties

The reprogrammable logic in the iSoC uses fully integrated 3D FPGAs that employ (a) selective reprogrammability, (b) on-demand reconfigurability, (c) auto-programming, (d) load rebalancing and (e) power optimization.

ADVANTAGES OF THE PRESENT SYSTEM

The integration of multiple FPGAs in a single device produces a synergistic interactivity effect with numerous performance and flexibility benefits. 3D FPGAs provide optimal efficiency and multi-functionality.

DESCRIPTION OF THE INVENTION

The present disclosure describes solutions to problems involving constructing and optimizing reprogrammable 3D logic devices.

(1) Programmable Floating Gate Topography in Multi-Layer 3D FPGA

The present invention describes a multi-layer 3D FPGA in which the layers work asynchronously. Through silicon vias (TSVs) connect the layers of the 3D FPGA. TSVs connect individual tiles between layers to allow communication between the layers and parts of layers.

Each layer has a different function and operates independently from other layers. In one embodiment of the present invention, memory layers are sandwiched between separate FPGA layers in order to provide supplementary memory to the parallel functional layers.

In the present invention, specific rows of circuits on specific layers of the 3D FPGA go off-line to reconfigure and then come back on-line after the row has transformed to a new position to perform a specific logical function. This process allows the modulation of the overall FPGA in regular sequence to maximize performance. Because of the reordering circuits in rows on specific tiles in a multi-layer FPGA, parts of each layer maintain operation to allow continuous functioning, thereby minimizing down time. Since different layers perform different application functions, in order to maximize efficiency of operation, a specific layer is able to transform its hardware circuitry in a sequence that prioritizes a particular application.

(2) Gate Pivot to Contact Multiple Layers in 3D FPGA

A typical planar FPGA gate is a filament that moves to a new site in a cell circuit to complete a connection. In a multi-layer FPGA, however, adjacent layers are close enough to each other for the gates of one layer to extend to connect to the gates of another layer. This allows additional flexibility for transformation of the IC circuit. In CMOS multi-layer fabrication architectures the layers are very close together. These 9-layer FPGA 3D modules are then combined to form a stack of 12 modules in a single node. The multi-layer gate extension is limited to adjacent layers in the integrated CMOS 9-layer stack.

In order to perform the inter-layer connection, the gates use a pivot hinge as an initial motion delay. The hinges on the interior of the chip layer plane retract in a joint socket by 90 to 180 degrees. The hinge uses a retractable joint socket with a pivot that provides the shoulder 270 degree movement at the corner hinge mechanism.

In a further embodiment, the TSVs are themselves movable gates.

In another embodiment of the present system, smaller gates will make contact by meeting in the middle. This saves time, and energy because each half-gate will not need to move as far as a full size gate.

(3) Logic Block Clusters in Interior and LUT and SRAM on Anterior of each Layer of 3D FPGA Traditional planar FPGAs use "configurable logic blocks" (Xilinx) or "logic array blocks" (Altera) as programmable logic circuitry. The logic blocks are arranged as adjacent cells on the interior of a 2D circuit. The logic blocks access look up tables (LUTs) for program instructions and use static random access memory (SRAM), erasable programmable read only memory (EPROM) or flash memory for memory storage or access. The logic blocks use configurable interconnects that are arranged between a grid of fixed filaments and the LUTs. The logic blocks are connected between fixed interconnects using configurable switches.

The present system uses layers of FPGAs in a multi-layer configuration. Up to a dozen stacks of multi-layer FPGAs are combined in a single 3D node. Each layer consists of a cluster of sixteen logic blocks arranged four by four. As an example, each logic block is 1 mm by 1 mm so that the combined surface of the logic block clusters is 4 mm by 4 mm including boundaries. The data used by the logic block clusters are 8 bytes wide. If the FPGA layer operates at a clock speed of 500 MHz, this allows for a maximum 8 Gb/s data transfer rate.

Each logic block is arranged as an adjacent tile. The advantage of using sixteen tiles on a layer is that each tile may be reprogrammed independently. The LUTs and the memory tiles are located on the anterior (sides) of each layer, while the logic block clusters are located on the interior of the layer.

(4) Autonomous Inter-Layer Information Sharing in 3D FPGAs

Secondary LUTs on other layers are accessed by different layers than those on which the logic blocks are located. Sharing LUTs on a 3D FPGA between layers provides supplementary capabilities to the traditional model that both accelerates the process and provides additional flexibility.

Furthermore, the system uses multi-level memory in a 3D FPGA beyond what is provided on a specific layer itself. By using on-layer memory combined with alternative layer memory in the 3D FPGA node as well as memory from memory nodes, the present 3D model has far more flexibility than traditional models.

Specific layers on the 3D FPGA are used for differentiated dedicated functional applications. However, the FPGA changes functions of a specific layer on demand, much like a constantly transforming department store that changes the contents of its departments.

Because the center layers are strategically located in a stack of layers in the 3D FPGA, information from them is accessed more frequently by the overall system. Since these layers are accessed more frequently, they store more information than other layers on the periphery.

(5) Intermittent Restructuring of Multiple Layers of 3D FPGA

Given the configuration of the multi-layer 3D FPGA described here, each layer is seen as operationally autonomous yet capable of sharing information between layers and nodes. Any single layer transforms its configuration independently of the transformability of other layers, thereby allowing the FPGA as a whole to partially adjust while maintaining functionality on other layers. This same principle is applied to individual tiles or to clusters of tiles on specific layers as well. This is similar to the way in which a road repair can be performed on a segment while other parts of the road continue to be used by motorists. Reconfiguring only parts of the FPGA module saves time compared to the traditional transformation process. This independent layer functionality allows the 3D FPGA to perform continuous switching for continuous reprogrammability.

In a "conservative" version of a 3D FPGA, which is deterministic, the extent of evolution between ASIC hardware configuration positions is restricted. This limitation between specific positions means decreased flexibility but provides much faster performance.

By intermittently switching functions on different layers, the 3D FPGA maintains maximum flexibility.

This intermittent restructuring scheme becomes particularly advantageous in the event that one of the chip's circuits fails. Though the overall performance will be relatively restricted in the event of the failure of a part, the architecture of the 3D FPGA will allow its continued operation in a fail-safe mode.

The process of restructuration of the whole FPGA proceeds in phases. Any one (or parts of one) or more layers may be off-line in a restructuration mode. This simultaneous restructuring of circuitry in a 3D FPGA is a major advance that is made possible because of the unique configuration of a multi-layer system outlined here. However, during the evolutionary phase, other layers are actively performing their structured operations. The restructuring process occurs row by row and tile by tile in order to maximize logical consistency. For instance, specific rows restructure in the top and bottom layers at one time and then the adjacent layers subsequently restructure.

In one embodiment, the data from memory is stored in an independence memory module during the restructuring process and then re-imported after the restructuration.

(6) Variable Timing of Reconfiguration in 3D FPGA

Not only are the layers of a 3D FPGA restructuring their logic circuitry intermittently, but also the timing of their restructuration is variable. The reconfiguration time of the FPGA is a key factor in optimizing performance functionality of the chip.

Different layers restructure at different rates in the current 3D FPGA, particularly because different layers perform specific functions. A layer with limited deterministic restructuration is transformed more rapidly because it has restricted flexibility. However, an indeterministic layer restructures relatively more slowly because it has more complex reconfiguration options.

Variable restructuring rates of logic blocks are modulated by asynchronous clocking of the FPGA.

Variable timing of restructuration of layers in a 3D FPGA is useful particularly for on-demand applications that have unforeseen requirements. This complex application setting allows coordination of more complex indeterministic and deterministic layers that increase overall reprogrammable flexibility.

(7) Multi-Functionality in 3D FPGA

Since the 3D FPGA uses different layers for different functions, the overall chip is used for multiple simultaneous ASIC operations at any given time. However, the current invention allows the continuous oscillation between ASIC circuit positions of each layer, thereby permitting the constant operation of the chip. In addition, since the different layers of the chip are used for different functions, the integrated functionality of the 3D FPGA is increasingly flexible. Different functions available within different layers are shared to complete tasks efficiently.

(8) 3D FPGA Integration in Hybrid 3D SoC Architecture

The 3D FPGA is a key ingredient in the 3D SoC. It represents a reprogrammable module that simultaneously provides maximum flexibility and optimum performance. When combined with multiple 3D FPGAs, the present system represents a quantum leap in performance from existing planar circuits as well as 3D MP circuitry designs.

The synthesis of multiple 3D FPGAs in the 3D SoC creates the 3D field programmable compute array (FPCA). In this important embodiment, the FPGAs are synchronized for maximum reprogrammability and performance. Different combinations of 3D FPGAs may be united in different configurations. For instance, primarily deterministic FPGAs are combined with primarily indeterministic FPGAs in order to obtain the benefits of both architectures, such as rapid restructuration as well as maximum flexibility in an uncertain environment, to maximize performance.

The coordination of multiple FPGAs also involves the sharing of memory and instructions on different devices. This process of sharing resources extends the utility of each FPGA beyond its specific limits. The advantage of working with multiple FPGAs in a network is that they work asynchronously to solve independent problems as well as work together to solve more complex problems in a network configuration. Multiple FPGAs work together by dividing functions and sharing tasks in a division of labor. This function sharing process scales as additional FPGAs are added to the collective. The FPGAs create interactive networks, both within and among neighborhood clusters.

In one embodiment, layers of one FPGA work with the layers of other FPGAs even as the remainder of each respective FPGA works independently. This networking model provides additional fail-safe functionality as well as the benefit of each FPGA's autonomy and performance maximization.

Further, the use of multiple FPGAs in parallel configurations allows the simultaneous solution of different classes of problems. The FPGAs share not only resources but problem solving techniques to solve MOOPs as efficiently as possible. This model of the FPGA sharing parallel multiple FPGA resources is also scalable. The addition of new FPGA nodes allows the network to add linkages and improve computability resources and solutions correspondingly.

(9) Tracking 3D FPGA Performance

Deterministic FPGAs move from one ASIC position to another ASIC position with evolvable hardware circuitry yet are relatively simple to model and track. The performance of indeterministic FPGAs, on the other hand, is, by definition, difficult to track in part because they may be continuously reprogrammable as they interact with an uncertain and unpredictable environment.

The present system records the tracking behavior of the 3D FPGA by recording the information on configuration transformation to memory. As the FPGA layers oscillate to different positions, the new positions are recorded and stored.

This tracking process is important because as the FPGA responds to an environment, it may be necessary to recall the response mechanisms used in an experimentation process rather than reengage in a short-sighted restructuration process. Tracking the FPGA configuration pathways is critical to maintaining a learning mechanism that will optimize behaviors in an embedded computer system.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.) the terms (including a reference to a "means") used to describe such elements are intended to correspond, unless otherwise indicated, to any element that performs the specified function of the described element (i.e., that is functionally equivalent), even though not structurally equivalent to the disclosed structure that performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

Acronyms 3D, three dimensional

AIS, artificial immune system

ASIC, application specific integrated circuit

BOOP, bi-objective optimization problem

CMOS, complementary metal oxide semiconductor

CPLD, complex programmable logic device

D-EDA, dynamic electronic design automation

DIVA, data intensive architecture

DLP, data level parallelism

EC, evolutionary computation

EDA, electronic design automation

EHW, evolvable hardware eMOOP, evolvable multi-objective optimization problem

FLOPS, floating operations per second

FPCA, field programmable compute array

FPGA, field programmable gate array

GA, genetic algorithm

HDL, hardware description layer

HPPS, high performance processing system

ILP, instruction level parallelism

IP, intellectual property iSoC, intelligent system on a chip

LUT, look up table

MEMS, micro electro mechanical system

MONARCH, morphable networked micro-architecture

MOOP, multi-objective optimization problem

MPSOC, multi-processor system on a chip

NEMS, nano electro mechanical system

NoC, network on a chip

PCA, polymorphous computing architecture

PIM, processor in memory

RISC, reduced instruction set computing

SCOC, supercomputer on a chip

SoC, system on a chip

SOI, silicon on insulation

SOPC, system on a programmable chip

SPE, synergistic processor element

SPR, synthetic placement and routing

TLP, thread level parallelism

TRIPS, Tera-op reliable intelligently adaptive processing system

TSV, through silicon via

VLSI, very large scale integration

WSPS, wafer level processed stack packages

DESCRIPTION OF THE FIGURES

FIG. 24 is a table showing the categories of applications of an ASIC and FPGA.

DETAILED DESCRIPTION OF THE FIGURES

Figure 1:
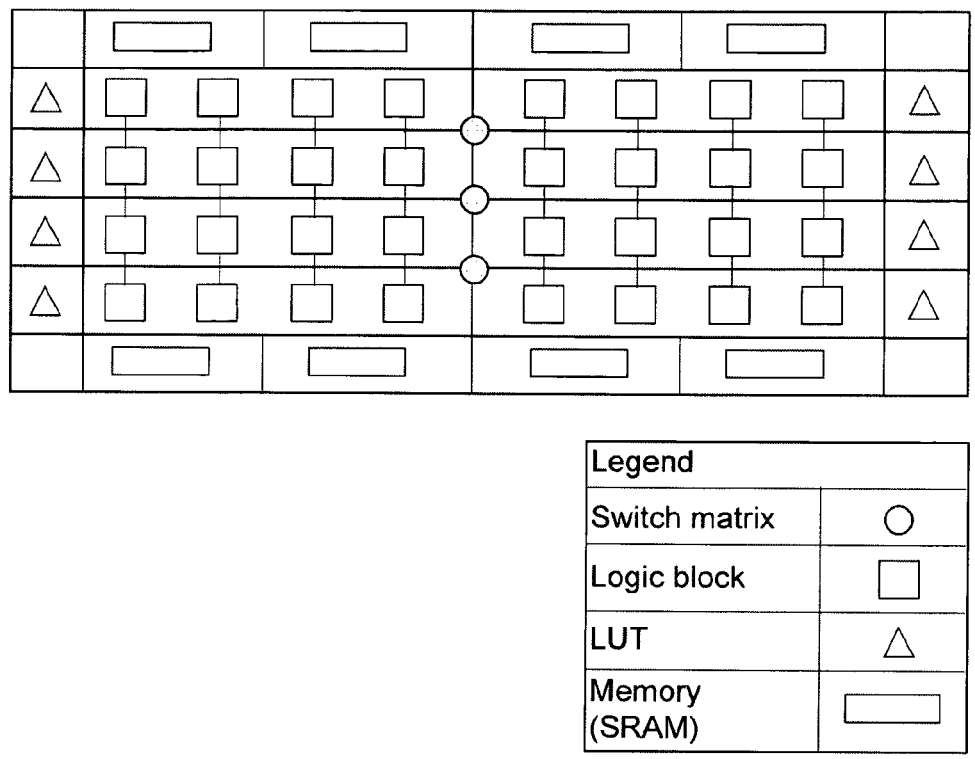
FIG. 1 is a schematic diagram showing the top view of an FPGA layer in a multilayer FPGA IC.

FIG. 1 shows the top view of an FPGA layer in a multilayer FPGA IC. The logic blocks are shown as box configurations on the interior layers of the FPGA. The (SRAM) memory is shown as rectangles on the outside layer on the top and bottom of the device. The look up tables (LUTs), shown as triangles, are located on the outside layer on the left and right sides of the device. The switch matrix component is shown as a circle. The FPGA operates after the switch matrix receives program code to restructure the configuration of the logic block arrays, which access the LUTs and store data in memory. The FPGA structures its logic array interconnects into an ASIC position in order to perform a specific task.

Figure 2:
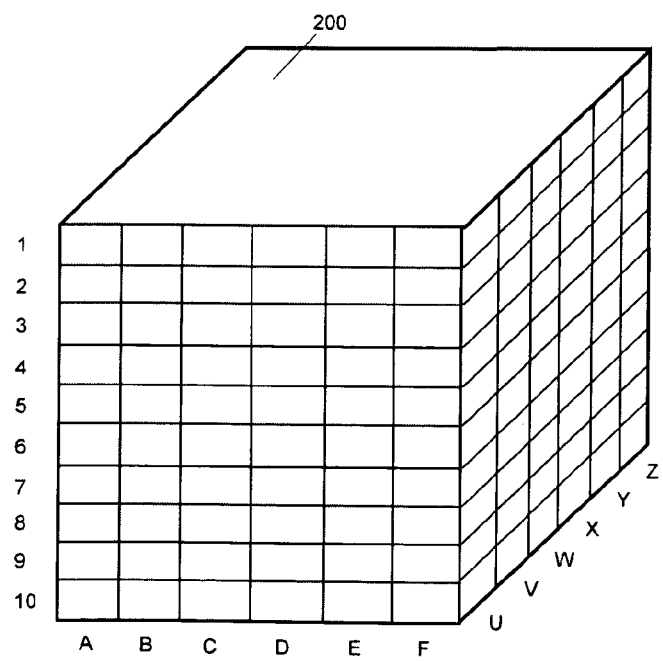
FIG. 2 is a schematic diagram showing a view of a multilayer FPGA.
Figure 3:
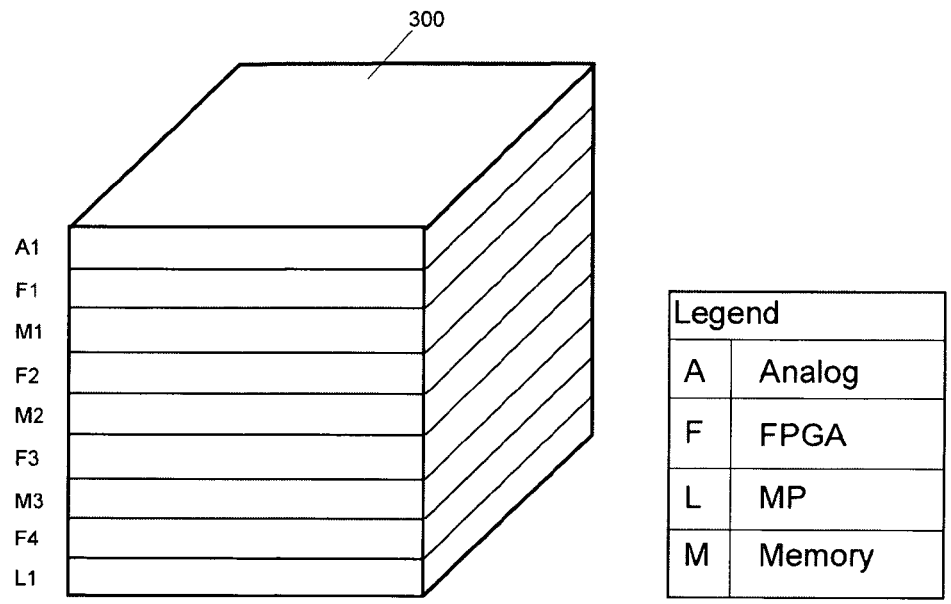
FIG. 3 is a schematic diagram of a hybrid 3D multilayer IC.
Figure 4:
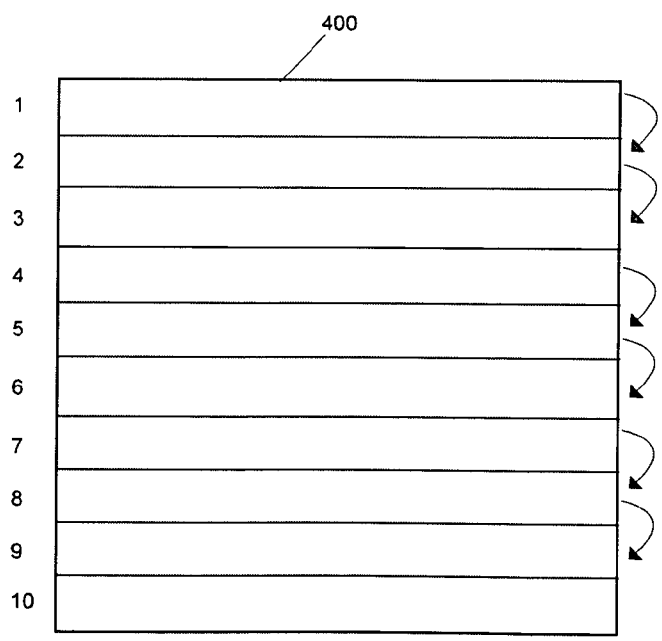
FIG. 4 is a schematic diagram of a multilayer IC view in which layers of FPGAs change positions of logic arrays in sequence.

FIG. 2 shows a view of a multilayer FPGA (200) with ten layers. FIG. 3 shows a hybrid 3D multilayer IC (300). The 3D node consists of analog (A1), FPGA (F1, F2, F3 and F4), microprocessor (L1) and memory (M1, M2 and M3) layers. FIG. 4 shows a multilayer IC (400) view in which layers of FPGAs change positions of logic arrays in sequence. The timing of the changing of positions of the FPGA layers shown here are one to two, two to three and then four to five and five to six and then seven to eight and eight to nine. The constant restructuring of the layers of the multilayer FPGA module promote efficiency of the overall module, so that some layers are inactive when in the process of restructuring while the overall module is continuously active.

Figure 5:
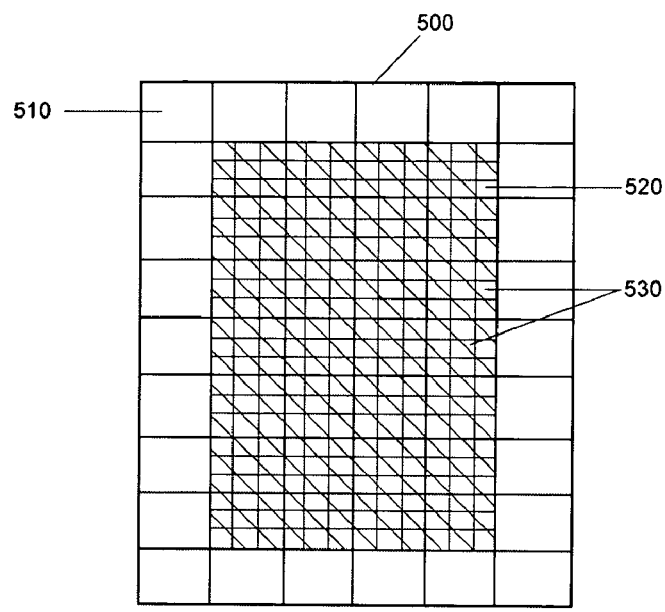
FIG. 5 is a schematic diagram of a top view of pivoting gates in a FPGA layer in a multilayer IC.

FIG. 5 shows a top view of pivoting gates in a FPGA layer (500) in a multilayer IC. The internal tiles contain logic block arrays (520 and 530) that reposition to new ASIC positions.

Figure 6:
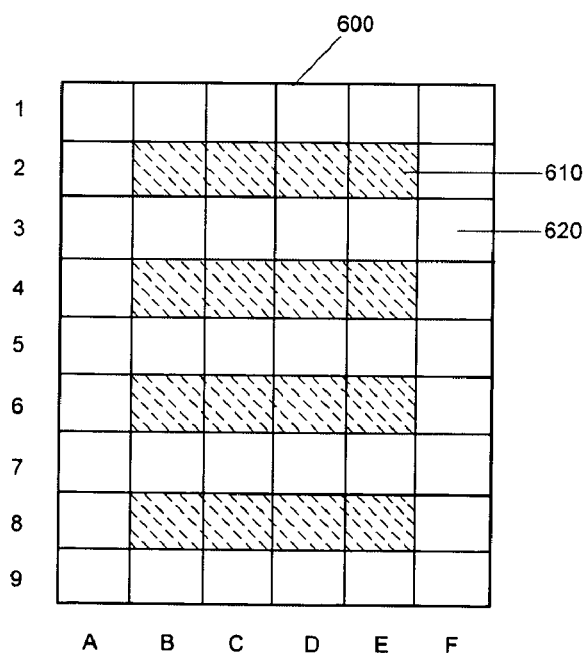
FIG. 6 is a schematic diagram of a side view of alternating layers of a multilayer FPGA with hinged gates.
Figure 7:
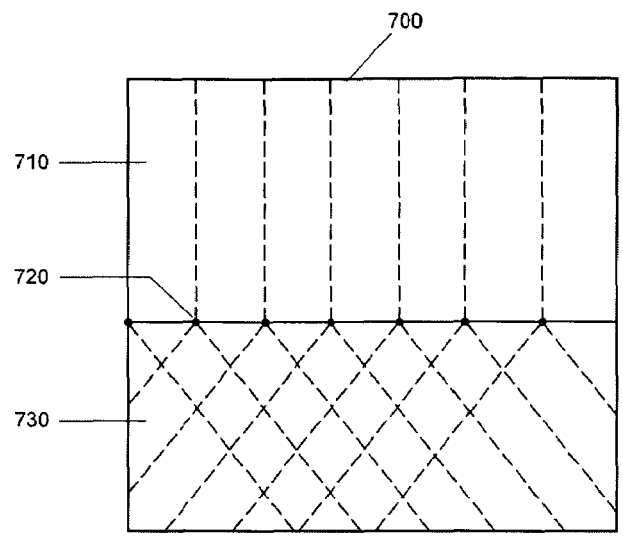
FIG. 7 is a schematic diagram of a side view of two layers of a multilayer FPGA with hinged gate pivots (shown moving) in the lower layer.

FIG. 6 shows a side view of alternating layers of a multilayer FPGA (600) with hinged gates. The gates extend from one layer to an adjacent layer. FIG. 7 shows a side view of two layers of a multilayer FPGA with hinged gate pivots (shown moving) in the lower layer. In the top layer, the gates (710) are positioned vertically in a passive position. In the bottom layer, the gates (730) are moving to a specific position between adjacent layers.

Figure 8:
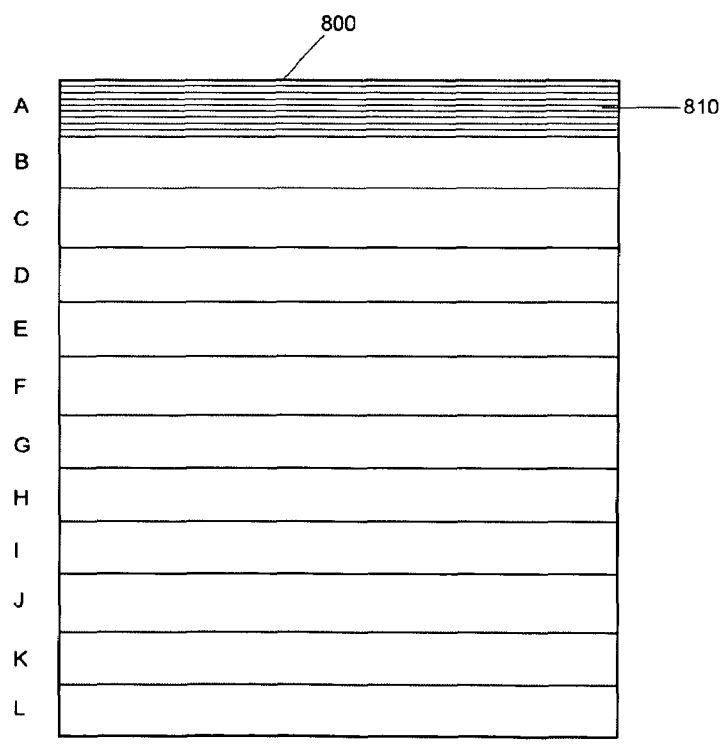
FIG. 8 is a schematic diagram of multilayer IC with a highlighted multi-layer CMOS integrated layer.

FIG. 8 shows a multilayer IC (800) with a highlighted multi-layer CMOS integrated layer (810).

Figure 9:
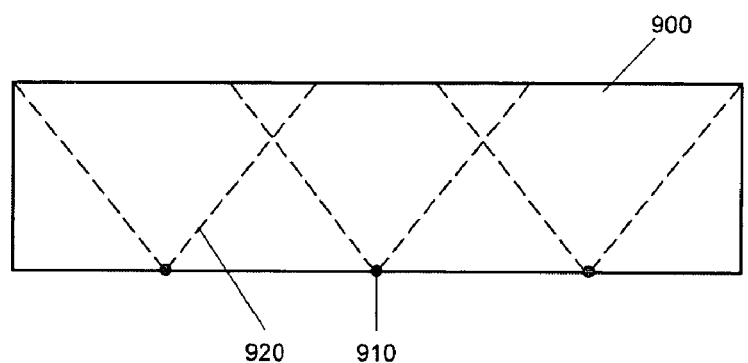
FIG. 9 is a schematic diagram of hinges attached to gates on a layer of a multilayer FPGA.
Figure 10:
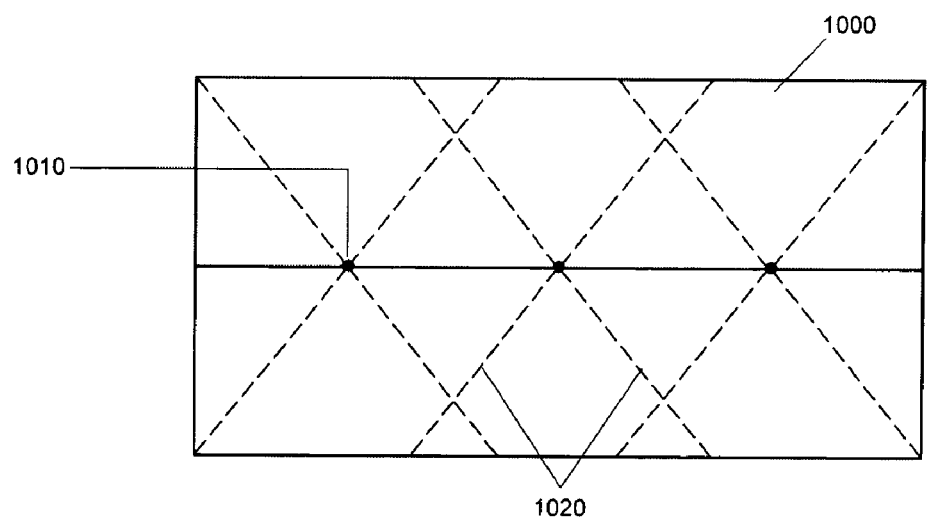
FIG. 10 is a schematic diagram of movable gates on hinges on tiles between two layers of a multilayer FPGA.
Figure 11:
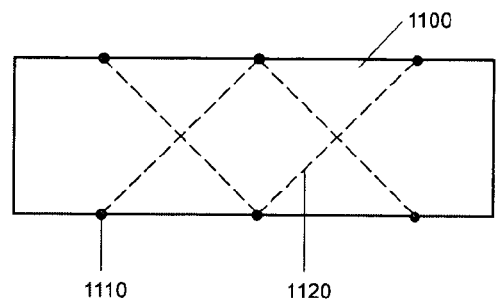
FIG. 11 is a schematic diagram of gates from two layers of a multilayer FPGA which meet in the middle of one tile.

FIG. 9 shows hinges attached to gates on a layer of a multilayer FPGA. The hinges (910) pivot between positions (920) on adjacent FPGAs to perform a restructuring process. FIG. 10 shows movable gates (1020) on hinges (1010) on tiles between two layers of a multilayer FPGA. FIG. 11 shows gates (1120) from two layers of a multilayer FPGA which meet in the middle of one tile. The hinges (1110) move the half sized gates (1120) to meet in the middle of two adjacent layers. This process maximizes the efficiency of using smaller gate sizes for faster restructuring.

Figure 12:
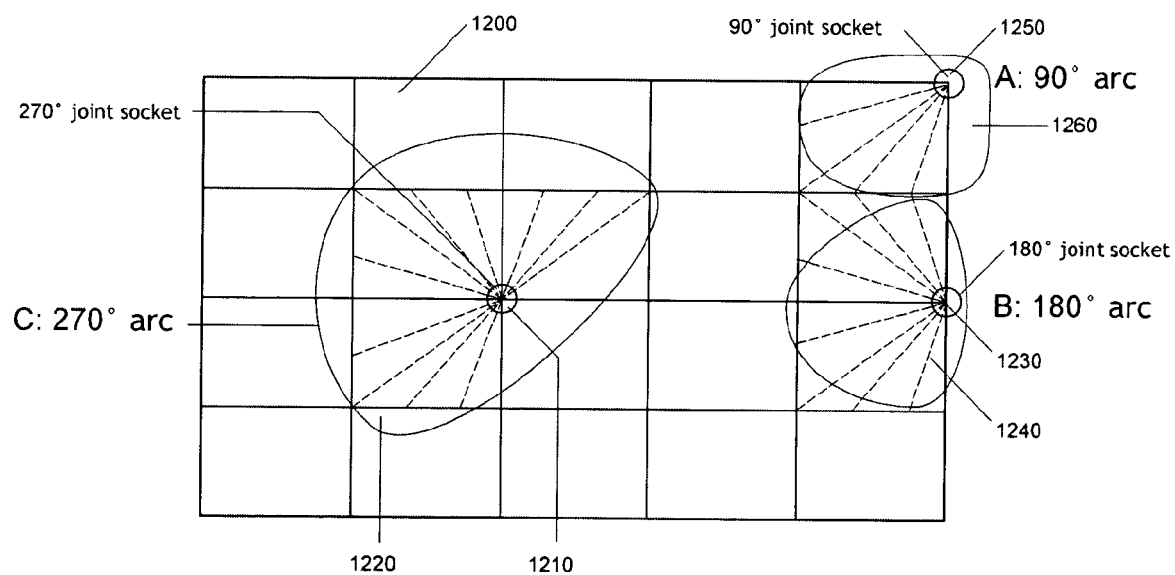
FIG. 12 is a schematic diagram of movable gates attached to hinges on joints between tiles in a multilayer FPGA in which the joints move 90, 180 and 270 degrees.

FIG. 12 shows movable gates attached to hinges on joints between tiles in a multilayer FPGA in which the joints move 90, 180 and 270 degrees. The joint socket (1250) at A (1260) moves at a 90 degree arc. The joint socket (1230) at B (1240) moves at a 180 degree arc. The joint socket (1210) at C (1220) moves at a 270 degree arc. The use of variable range joint sockets allows the multilayer FPGA to position different types of joints at different locations for maximum flexibility.

Figure 13:
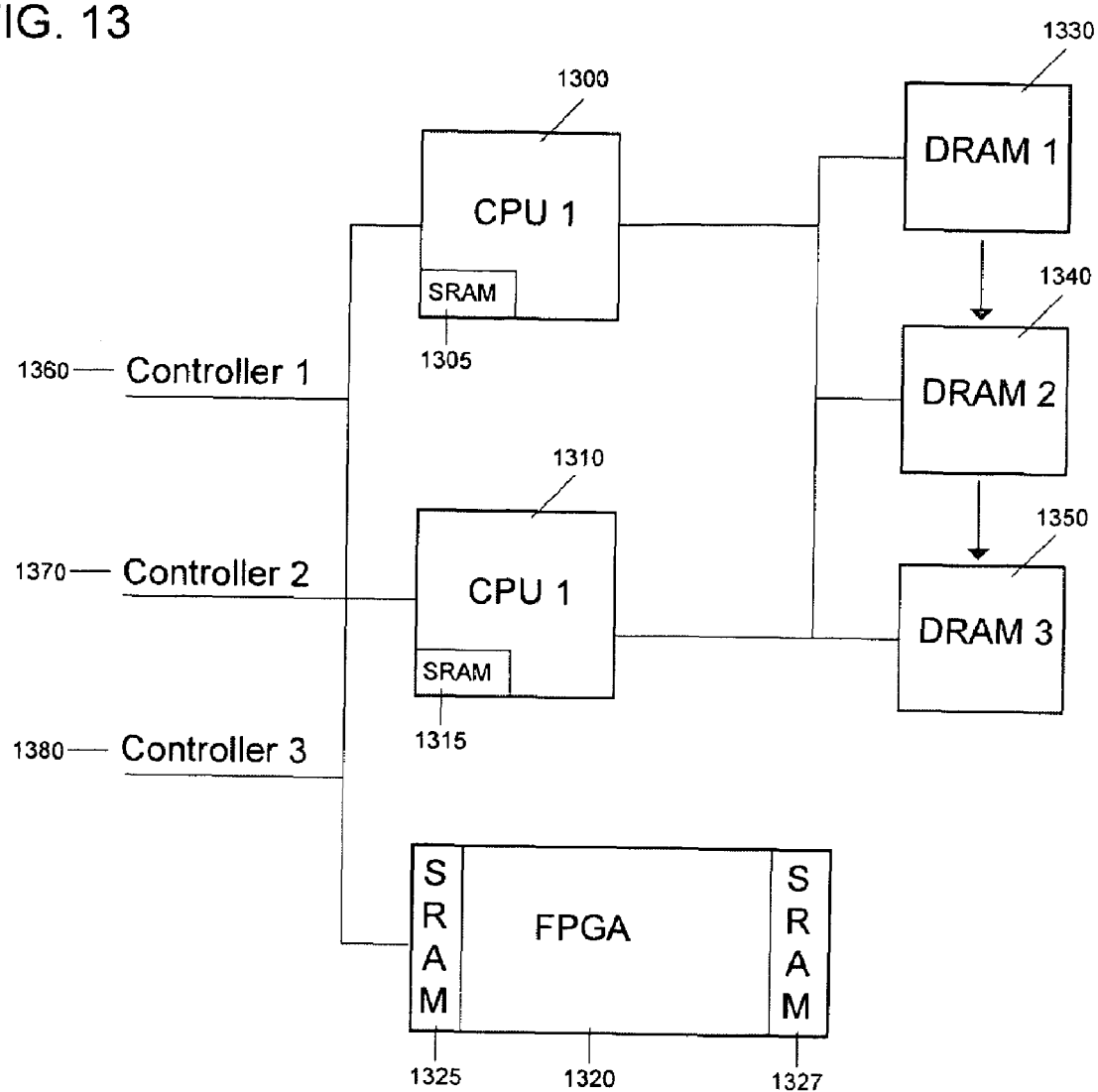
FIG. 13 is a block diagram of two CPUs connected to an FPGA, three controllers and three memory devices in a multilayer SoC.

FIG. 13 is a block diagram of two CPUs (attached to two memory modules) and two FPGAs connected to four controllers in a multilayer node in a SoC. The CPUs (1300 and 1310) each have on-board SRAM (1305 and 1315) as well as access to external DRAM (1330, 1340 and 1350) memory layers. The FPGA (1320) uses on-board SRAM (1325 and 1327). The three logic devices interface with controllers (1360, 1370 and 1380) for specific applications.

Figure 14:
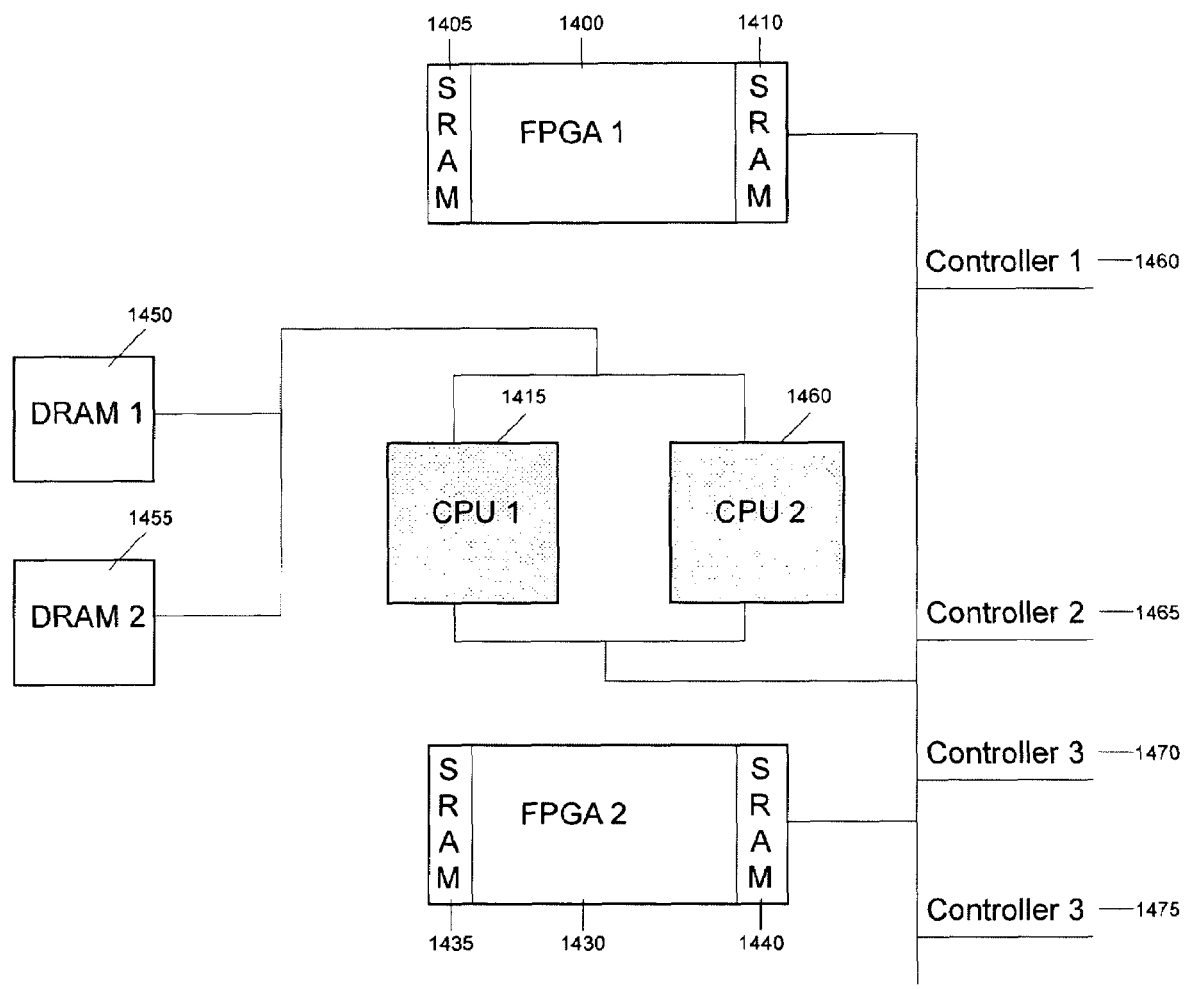
FIG. 14 is a block diagram of two CPUs (attached to two memory modules) and two FPGAs connected to four controllers in a multilayer SoC.

FIG. 14 is a block diagram of two CPUs (attached to memory modules) and two FPGAs connected to four controllers in a multilayer SoC. The CPUs (1415 and 1460) are connected to the external DRAM (1450 and 1455). The FPGAs (1400 and 1430) contain internal SRAM components (1405, 1410, 1435 and 1440). The four logic devices are connected to four controllers (1460, 1465, 1470 and 1475).

Figure 15:
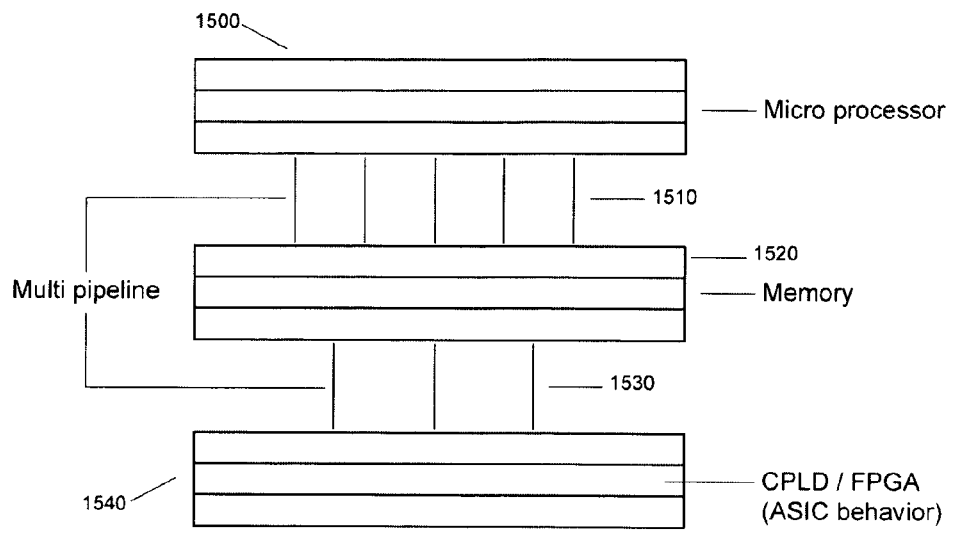
FIG. 15 is a schematic diagram of a multilayer hybrid IC with multiple pipelines between microprocessor, memory and FPGA layers.

FIG. 15 shows a multilayer hybrid IC with multiple pipelines between microprocessor, memory and FPGA layers. The microprocessor layers (1500) are connected to the memory layers (1520) by multiple pipelines (1510). The FPGA layers (1540) are connected to the memory layers (1520) by multiple pipelines (1530).

Figure 16:
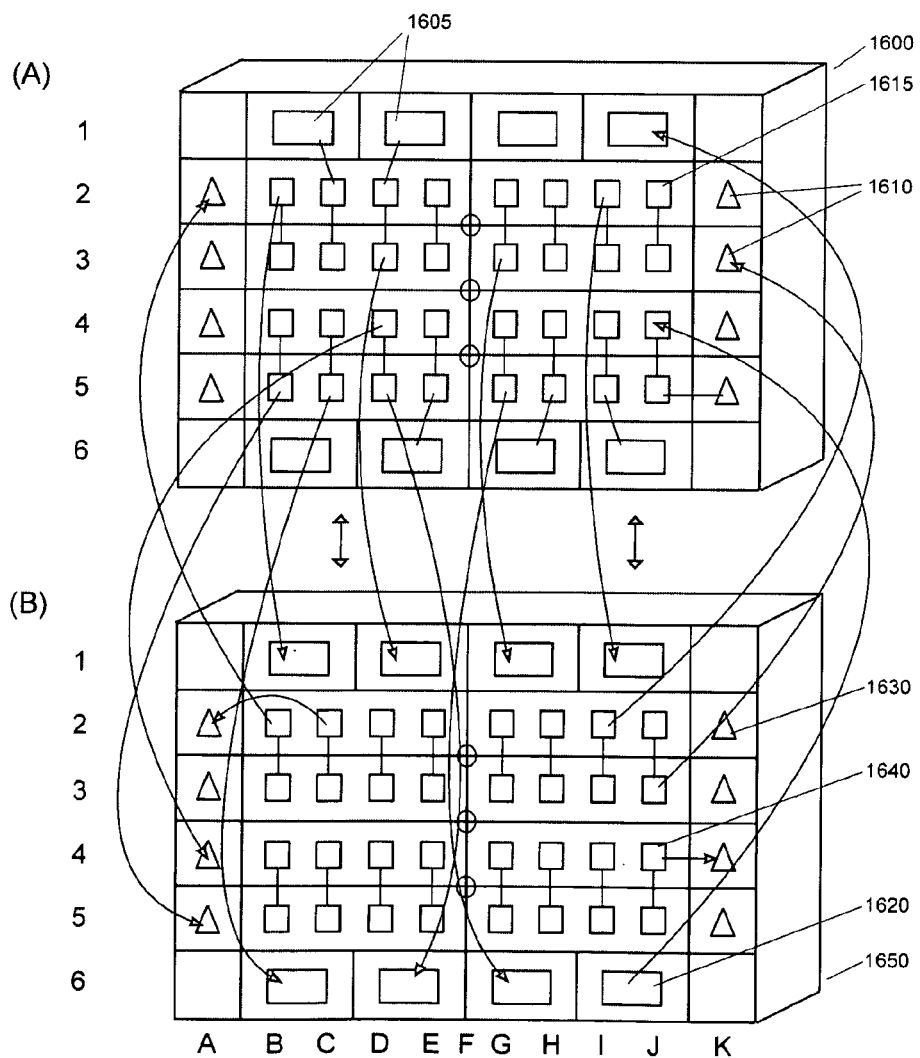
FIG. 16 is a schematic diagram of two adjacent FPGA layers in a multilayer IC that access each others' LUTs and SRAM.

FIG. 16 shows two adjacent FPGA layers in a multilayer IC that access each others' LUTs and SRAM. The logic block arrays in the top FPGA access the SRAMs and LUTs on the bottom FPGA. The logic block arrays in the bottom FPGA access its own LUTs and the LUTs and SRAMs of the top FPGA. This multiple parallel processing of logic and data using multiple FPGA layers maximizes the capacity of the computing system.

Figure 17:
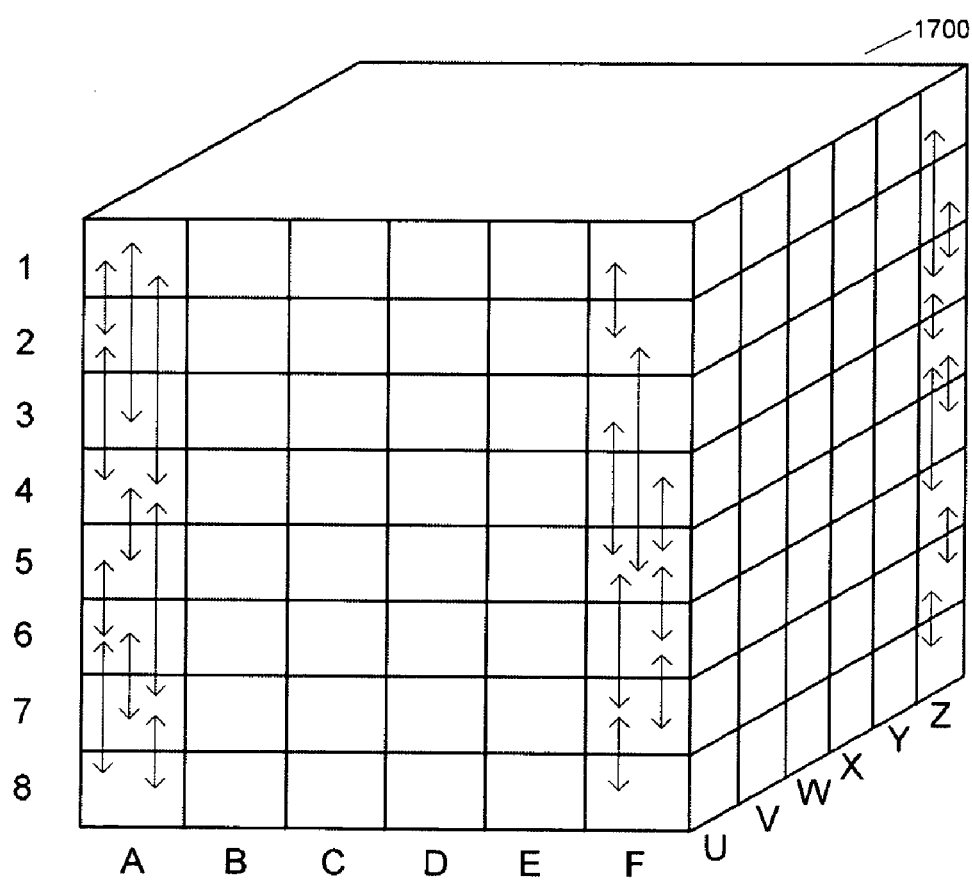
FIG. 17 is a schematic diagram of a multilayer FPGA with interlayer memory sharing.

FIG. 17 shows a multilayer FPGA with interlayer memory sharing. The LUTs on the outside tiles of the FPGAs interact by using TSVs within the multilayer IC. The system resembles elevator shafts in a high rise building as they move data from floor to floor to meet the demands of the users.

Figure 18:
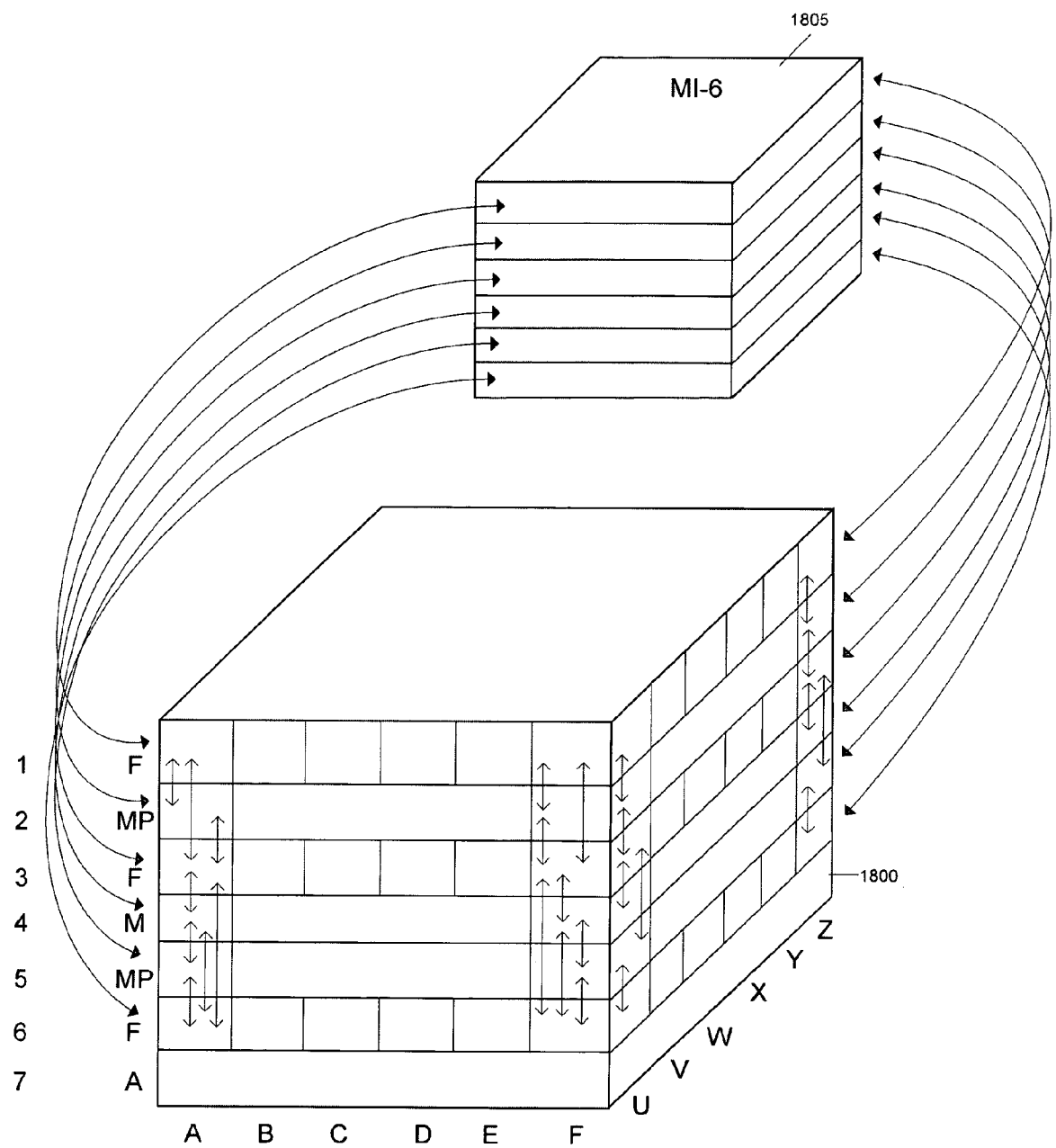
FIG. 18 is a schematic diagram of a multilayer IC, with FPGA layers and memory layers, interacting with a multilayer memory module.

FIG. 18 shows a multilayer IC, with FPGA layers and memory layer, interacting with a multilayer memory module. The memory module (1805) has six layers while the hybrid multilayer logic module (1800) has seven layers. The hybrid logic module has microprocessors (layers two and five), FPGAs (layers one, three and six), a memory layer (layer four) and an analog layer (layer seven). The logic module routes data from memory component to memory component on the various layers, including memory tiles of logic layers. The logic device stores data in and accesses data from the multi-layer memory module.

Figure 19:
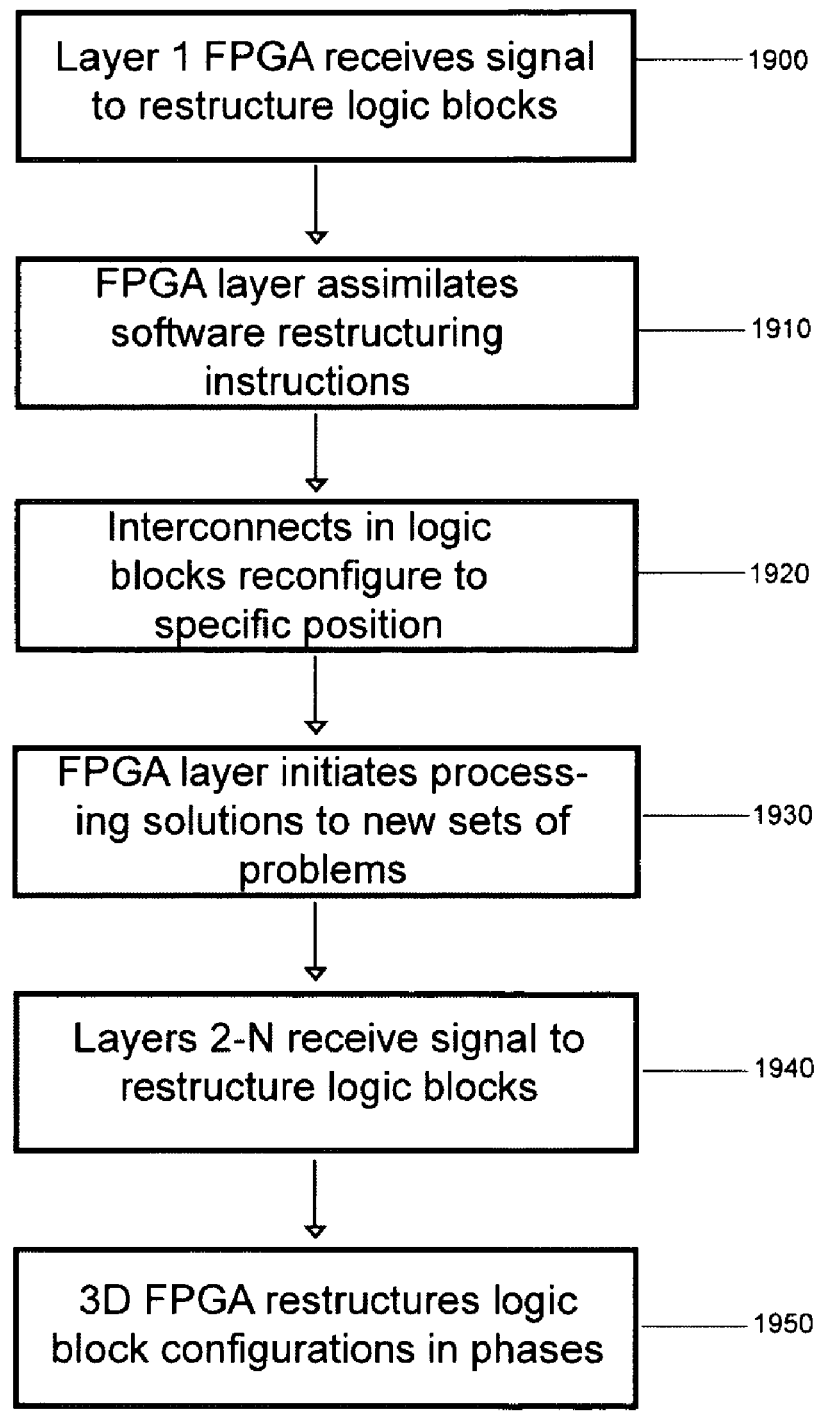
FIG. 19 is a flow chart showing the process of reconfiguration of a FPGA layer in a multilayer IC.

FIG. 19 is a flow chart showing the process of reconfiguration of a FPGA layer in a multilayer IC. After the layer 1 FPGA receives a signal to restructure its logic blocks (1900), the FPGA layer assimilates software restructuring instructions (1910) The interconnects in the logic blocks then reconfigure to a specific position (1920) and the FPGA layer initiates processing solutions to new sets of problems (1930). Layers two through N receive a signal to restructure their logic blocks (1940) by using IMSAs and the 3D FPGA restructures logic block configurations in phases (1950).

Figure 20:
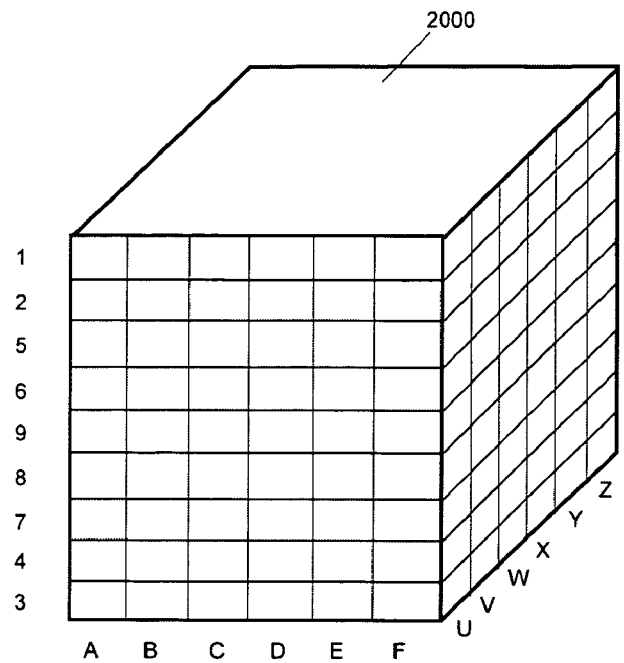
FIG. 20 is a schematic diagram showing the order of restructuring of layers in a 3D FPGA.
Figure 21:
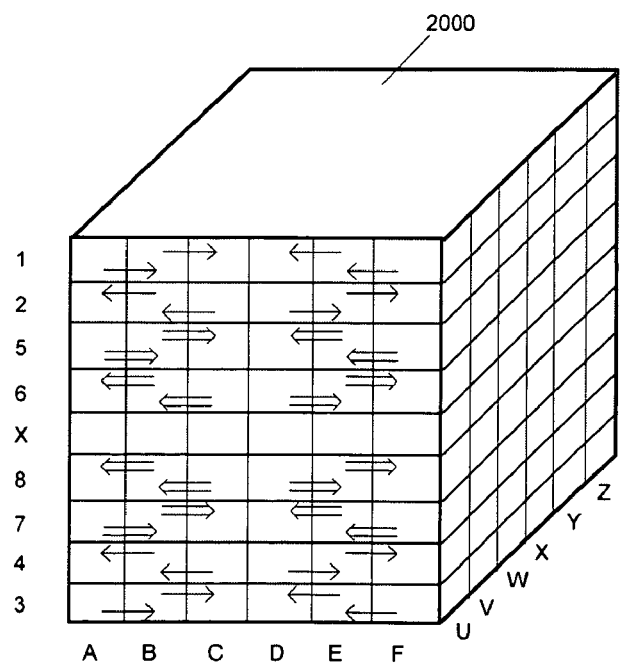
FIG. 21 is a schematic diagram showing the variable rates and directions of restructuring of a multilayer FPGA.

FIG. 20 shows the order of restructuring of layers in a 3D FPGA. On the left scale, the sequence of restructuring of the layers is show to be 1, 2, 5, 6, 9, 8, 7, 4 and 3 for layers 1 through 9. FIG. 21 shows the variable rates and directions of restructuring of a multilayer FPGA. In the drawing representation, the first two layers and the last two layers are slowly restructuring as depicted by the single arrows. Layers three, four, six and seven are restructuring at much faster rates. The center layer is not restructuring. The sequence of restructuring is shown as 1, 2, 5, 6, 8, 7, 4 and 3 for layers 1, 2, 3, 4, 6, 7, 8 and 9.

Figure 22:
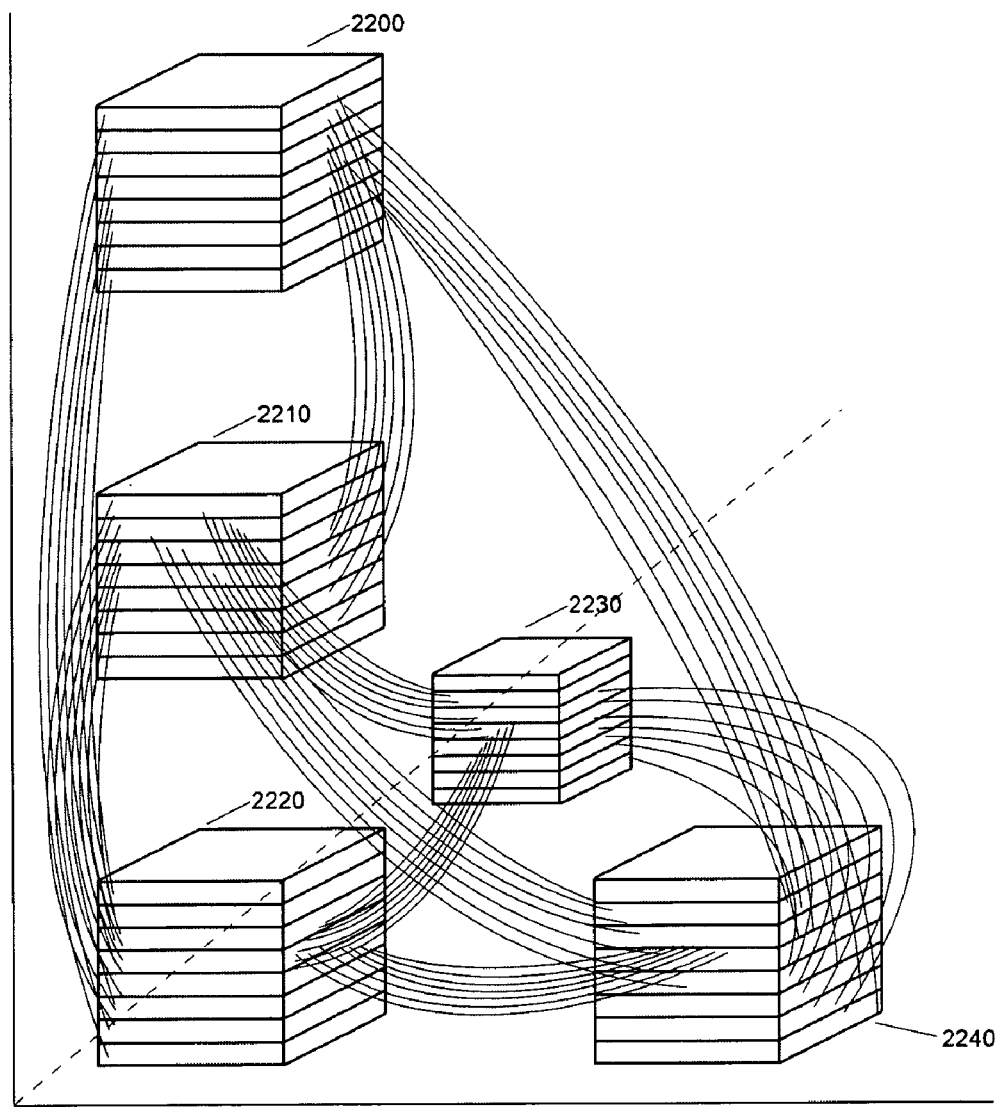
FIG. 22 is a schematic diagram showing the flows between layers of 3D FPGAs and 3D memory modules in a 3D iSoC neighborhood cluster.

FIG. 22 shows the flows between layers of 3D FPGAs and 3D memory modules in a 3D iSoC neighborhood cluster. The flows of data between nodes at 2200, 2210, 2220, 2230 and 2240 within a cluster of nodes shows the origins and destinations of data sets on various layers of the nodes using multiple pipelines.

Figure 23:
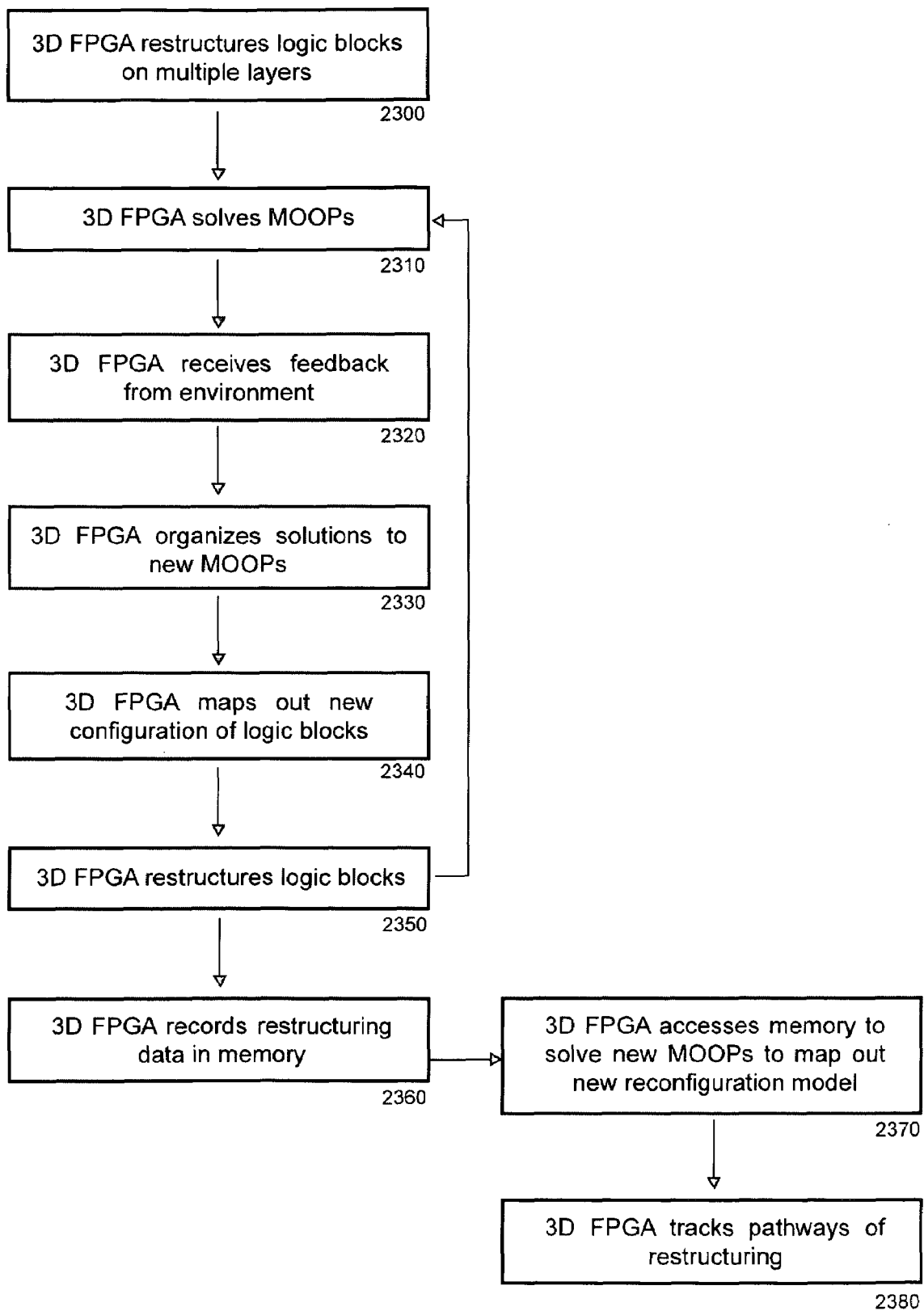
FIG. 23 is a flow chart showing the restructuring process of a 3D FPGA as it interacts with its indeterministic environment.

FIG. 23 is a flow chart showing the restructuring process of a 3D FPGA as it interacts with its indeterministic environment. After the 3D FPGA restructures its logic blocks on multiple layers (2300), it solves MOOPs (2310) and receives feedback from the environment (2320). The 3D FPGA organizes solutions to new MOOPs (2330) and maps out a new configuration of logic blocks (2340). The 3D FPGA restructures logic blocks (2350) as it continues to solve MOOPs, records the restructuring data in memory (2360) and accesses memory to solve new MOOPs to map out a new reconfiguration model (2370). The 3D FPGA then tracks the pathways of restructuring (2380) for future reference.

FIG. 24 shows the categories of applications of an ASIC and FPGA. The 3D FPGA has advantages in solving MOOPs in an evolutionary environment as it maximizes predictive and anticipatory behaviors by using hybrid metaheuristics for continuous co-evolution.

I claim:

1. A system for organizing reprogrammable three dimensional (3D) field programmable gate arrays (FPGAs), comprising:
    a set of arrays of logic and memory components on two or more layers of a hybrid multilayer logic device;
    a set of SRAM tiles on the outer edge of each layer;
    a set of logic block arrays on tiles in the interior of each layer arranged in symmetrical rows connected by interconnects and TSVs;
    a set of switch matrices on tiles in the interior of each layer to connect the logic block arrays and the memory components with interconnects and TSVs;
    a set of look up tables (LUTs) on memory tiles for access to arithmetic data;
    movable interconnects within the logic block arrays that change position when activated by at least one switch matrix from one ASIC position to another ASIC position; and
    a set of TSVs that connect the tiles of one layer to the tiles of an adjacent layer.

2. A system of claim 1, wherein:
    The interconnects are positioned vertically between adjacent layers of the multilayer FPGA;
    The vertical interconnects move position when activated by at least one switch matrix; and
    The vertical interconnects activate the logic block array of one layer of the multilayer FPGA from the switch matrix of an adjacent layer.

3. A system of claim 1, wherein:
    A flexible joint activates the vertical interconnects to move position when activated by a switch matrix on an adjacent layer of a multilayer FPGA;
    The flexible joint moves at a 90 degree arc when positioned in a corner position;
    The flexible joint moves at a 180 degree arc when positioned in a side position on a tile; and
    The flexible joint moves at a 270 degree arc when positioned in a center position on a tile.

4. A system of claim 1, wherein:

Two flexible joints are activated on tiles of adjacent layers to activate the vertical interconnects to move position to meet in the middle when activated by two synchronized switch matrices of a 3D FPGA.

5. A system for organizing one or more layers of reprogrammable three dimensional (3D) field programmable gate arrays (FPGAs) in a multi-layer integrated circuit, comprising:

a set of arrays of logic and memory components on one or more layers of a hybrid multi-layer integrated circuit, each with a set of SRAM tiles, logic block array tiles and switch matrix tiles; and wherein the logic components of an FPGA layer store data and instructions in and access data and instructions from memory components on other layers of the multi-layer integrated circuit.

6. A system of claim 5, wherein:

At least one FGPA layer and at least one microprocessor layer are synchronized to work together to perform separate computational tasks in the multi-layer hybrid integrated circuit;

The FPGA layer activates specific application devices; and

The microprocessor layer activates specific application devices.

7. A system of claim 5, wherein:

Two or more FPGA layers in the multi-layer hybrid integrated circuit store data and instructions in and access data and instructions from SRAM tiles of adjacent layers; and The storing of and access to data and instructions in adjacent FPGA layers are performed by multiple parallel pipelines.

8. A system of claim 5, wherein:

One or more FPGA layers on a multi-layer hybrid integrated circuit store data and instructions in and access data and instructions from DRAM layers of other multi-layer memory modules.

9. A system for organizing one or more layers of reprogrammable three dimensional (3D) field programmable gate arrays (FPGAs) in a multi-layer integrated circuit, comprising:

a set of arrays of logic and memory components on one or more layers of a hybrid multi-layer integrated circuit, each with a set of SRAM tiles, logic block array tiles and switch matrix tiles;

wherein when the environment changes, a sensor is activated in the device application for each FPGA layer and the FPGA layer reconfigures the interconnects in the logic block arrays to a different ASIC layout structure; and wherein the multi-layer FPGA uses D-EDA modeling to design the customized placement and routing configuration of each change of phase state of the FPGA as it reprograms.

10. The system of claim 9, wherein:

One layer in the multi-layer hybrid IC models at least one FPGA layer for reconfiguration.

11. The system of claim 9, wherein:

At least one FPGA layer is reconfigured to solve evolving MOOPs as the environment changes;

As at least one FPGA layer restructures its logic block array to at least two configurations in a sequence, the data of the restructuration pattern are stored in a database;

When the multi-layer FPGA seeks to solve MOOPs in an evolving environment, it accesses the database to assess the new MOOPs by analyzing the factors of the past solutions; and At least one layer of the multi-layer FPGA solves MOOPs and continuously restructures its logic block arrays while reprogramming all the layers in the multi-layer FPGA.

* * * * *